(12) United States Patent
Voegeli

(10) Patent No.: US 8,334,147 B2
(45) Date of Patent: Dec. 18, 2012

(54) BIO-SENSOR WITH HARD-DIRECTION FIELD

(75) Inventor: Otto Voegeli, Morgan Hill, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 533 days.

(21) Appl. No.: 12/454,910

(22) Filed: May 26, 2009

(65) Prior Publication Data

US 2010/0302689 A1    Dec. 2, 2010

(51) Int. Cl.
*G01N 33/553*    (2006.01)
(52) U.S. Cl. ........................................ 436/526
(58) Field of Classification Search ............ None
See application file for complete search history.

(56) References Cited

U.S. PATENT DOCUMENTS

| | | | |
|---|---|---|---|
| 5,981,297 | A | 11/1999 | Baselt |
| 6,764,861 | B2 | 7/2004 | Prinz et al. |
| 6,844,202 | B2 | 1/2005 | Prinz et al. |
| 6,875,621 | B2 | 4/2005 | Tondra |
| 7,031,186 | B2 | 4/2006 | Kang et al. |
| 7,250,759 | B2 | 7/2007 | Kahlman |
| 2003/0049869 | A1 | 3/2003 | Prinz et al. |
| 2004/0120185 | A1 | 6/2004 | Kang et al. |
| 2005/0100930 | A1 | 5/2005 | Wang et al. |
| 2006/0291108 | A1 | 12/2006 | Sbiaa et al. |
| 2007/0034919 | A1 | 2/2007 | Wang et al. |
| 2007/0114180 | A1 | 5/2007 | Ramanathan et al. |
| 2007/0122898 | A1 | 5/2007 | Sharma |
| 2007/0159175 | A1 | 7/2007 | Prins |
| 2008/0054896 | A1 | 3/2008 | Kahlman |
| 2008/0106933 | A1 | 5/2008 | Lim |
| 2008/0255006 | A1 | 10/2008 | Wang et al. |
| 2009/0001983 | A1 | 1/2009 | Wittkowski |
| 2009/0096043 | A1 * | 4/2009 | Min et al. ............... 257/421 |
| 2009/0186770 | A1 * | 7/2009 | Shi et al. ............... 506/6 |

FOREIGN PATENT DOCUMENTS

WO    PCT/US 10/00944    5/2010

OTHER PUBLICATIONS

Cardoso, FA et al (2008) J. Appl. Physics 103: 07A310.*

* cited by examiner

*Primary Examiner* — N. C. Yang
*Assistant Examiner* — Richard Moerschell
(74) *Attorney, Agent, or Firm* — Saile Ackerman LLC; Stephen B. Ackerman

(57) ABSTRACT

A magnetic sensor for identifying small magnetic particles bound to a substrate includes a regular, planar orthogonal array of MTJ cells formed within or beneath that substrate. Each MTJ cell has a high aspect ratio and positions of stable magnetic equilibrium along an easy magnetic axis and positions of unstable magnetic equilibrium along a hard magnetic axis. By initializing the magnetizations of each MTJ cell in its unstable hard-axis position, the presence of even a small magnetic particle can exert a sufficient perturbative strayfield to tip the magnetization to its stable position. The magnetization change in an MTJ cell can be measured after each of two successive opposite polarity magnetizations of a bound particle and the presence of the particle thereby detected.

15 Claims, 9 Drawing Sheets

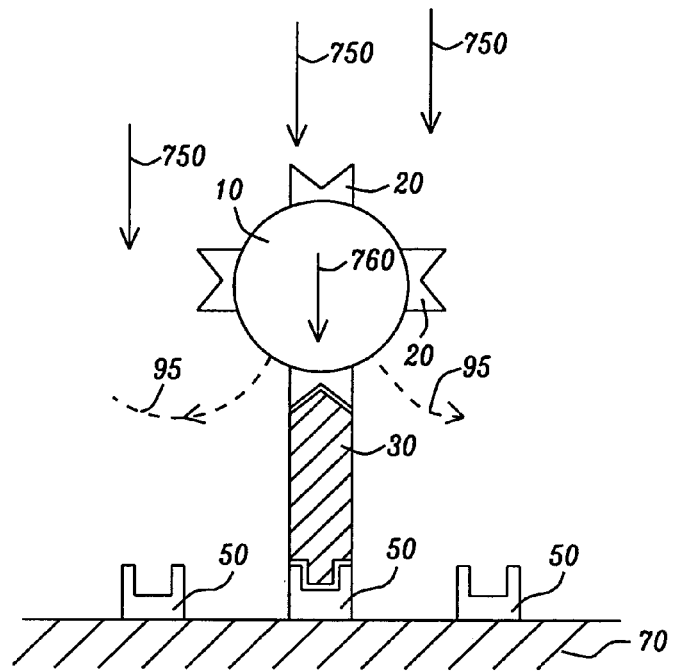
FIG. 1 – Prior Art
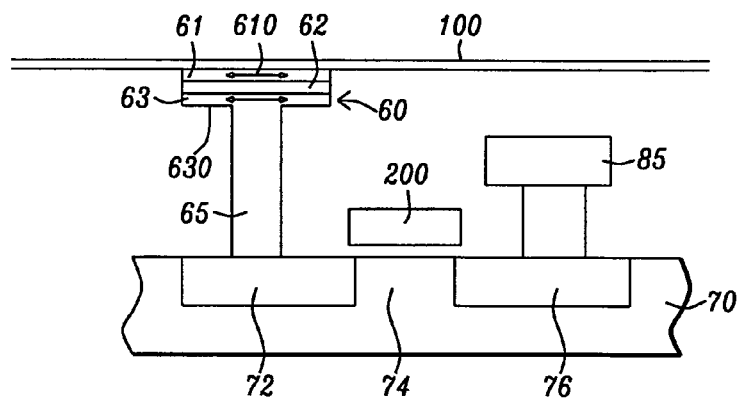
FIG. 2 – Prior Art

BIO-SENSOR WITH HARD-DIRECTION FIELD

BACKGROUND OF THE INVENTION

1. Field of the Invention

This invention relates to the detection of small magnetized particles by a magnetic sensor, particularly when such particles are attached to molecules whose presence or absence is to be determined in a chemical or biological assay.

2. Description of the Related Art

Magnetic devices have been proposed as effective sensors to detect the presence of specific chemical and biological molecules when, for example, such molecules are a part of a fluid mixture that includes other molecules whose detection is not necessarily of interest. The basic method underlying such magnetic detection of molecules first requires the attachment of small magnetic (or magnetizable) particles to all the molecules in the mixture that contains the specific molecules to be detected. Because of their small size these attached particles are "super-paramagnetic", meaning they ordinarily retain no meaningful magnetic moment. However, when placed in an external magnetic field, these particles develop an induced magnetic moment and can produce a corresponding magnetic field, which we will call a "strayfield" herein.

The magnetic particles are made to attach to the molecules in the mixture by coating the particles with a chemical or biological species that binds (e.g. by covalent bonding) to those molecules. Then, a surface (i.e., a substrate) is provided on which there has been affixed receptor sites (e.g. specific molecules) to which only the target molecules (the molecules whose presence is to be measured) will bond. After the mixture has been placed in contact with the surface so that the target molecules have bonded to it, the surface can be flushed in some manner to remove all unbound molecules. Because the bonded target molecules are equipped with the attached magnetic particles, it is only necessary to detect the magnetic particles to be able, at the same time, to assess the number of captured target molecules. Thus, the magnetic particles are simply "flags," which can be easily detected (and counted) once the target molecules have been captured by chemical bonding to the receptor sites on the surface. The issue, then, is to provide an effective method of detecting the small magnetic particles, since the detection of the particles is tantamount to detection of the target molecules.

One prior art method of detecting small magnetic beads affixed to molecules bonded to receptor sites is to position a magnetic sensor device beneath them; for example, to position it beneath the substrate surface on which the receptor sites have been placed.

FIG. 1 is a highly schematic diagram (typical of the prior art methodology and also exemplary of a portion of the present invention) showing a magnetic (i.e. magnetizable) particle (10) covered with receptor sites (20) that are specific to bonding with a target molecule (30) (shown shaded). The target molecule is shown as bonded to one of a plurality of identical sites (50) affixed to a substrate (70). The substrate (70) is covered with such receptor sites (50) that are also specific to the target molecule (30) and those sites should, in general, be different from the sites that bond the magnetic particle to the molecule. In general, the sites (20) and (50) are capable of bonding to different regions of the target molecule (30). The target molecule (30) is shown bonded to one of the receptor sites (50) on the surface. The magnetic particle (10), being super-paramagnetic because of its small size, must be magnetized by an external field (750) that is directed vertically downward, so that the induced magnetization of the particle (760) (shown as a downward directed arrow) has an external strayfield (95) with a component in the plane of the sensor substrate.

Referring to FIG. 2, there is shown a prior art magnetic sensor (60), similar to a structure used in magnetic random access memory (MRAM), that can be positioned beneath the receptor site of FIG. 1. As shown schematically in the cross-sectional view of FIG. 2, the prior art sensor (60) is based on a magnetic tunneling junction (MTJ) cell, that includes a magnetized "free" layer (61) whose magnetization direction (610) is free to move and a magnetized "pinned" layer (63) whose magnetization (630) is fixed in direction. The two layers are separated by a thin, non-magnetic and electrically non-conducting layer (62), the tunneling barrier layer. The sensor is incorporated within a circuit that can detect changes in the magnetic direction of the free layer relative to the pinned layer, by sensing the changes in the resistance of the sensor, which change is a function of the change in their relative directions. Typically, the MTJ cell is formed so that it has some degree of magnetic anisotropy which provides its magnetization directions (610) with some degree of stability against thermal perturbations and random magnetic fields.

An exemplary circuit includes a selection transistor (70) having a source region (72) to which the sensor element (60) is electrically connected (65), a gate region (74) over which runs a conducting wordline (200) that can effectively activate the gate and allow a sensing current between the source (72) and a grounded (85) drain (76). An electrically conducting bitline (100) contacts the top surface of the sensor to external circuitry and can provide the sensing current that passes between source and drain, thereby effectively measuring the resistance of the sensor.

Referring now to FIG. 3, there is shown an overhead view of the sensor in FIG. 2. By patterning the shape of the sensor into an elliptical form, whereby the sensor has a long dimension and a short dimension, the sensor can operate efficiently as a two-state or "bi-stable" device. The long dimension of the sensor defines an easy axis of magnetization, along which it is energetically favorable the sensor to retain its direction of magnetization. The two labeled directions of magnetization, $M_1$ and $M_2$, are therefore stable, forming the bi-stable state, and serve to store binary information. When the sensor is used as a memory element, as in MRAM devices, these two easy axis directions of magnetization serve as the storage directions because they define positions of stable equilibrium which are unlikely to be disrupted by thermal effects or random magnetic perturbations. Similarly, when such a cell is used as a detector of the presence of magnetized particles (as in an embodiment of the present invention), the two stable equilibrium magnetization directions are stable against perturbations not associated with the presence of a proximate detectable particle. Nevertheless, the cell must be sufficiently sensitive to register the presence of a proximate particle by flipping from one stable equilibrium state to the other.

The short dimension of the sensor defines a hard axis of magnetization, along which the direction of magnetization can be in either of two positions of unstable equilibrium, $M_4$ and $M_5$. These positions will tend to revert to $M_1$ and/or $M_2$ when properly perturbed, as by an external small magnetic field. This lack of stability is a reason why these directions are not used as storage directions. The aspect ratio of the elliptical shape determines $H_k$, the magnetic anisotropy produced by the shape anisotropy of the ellipse.

Referring to FIG. 4, there is shown an asteroidal curve that defines phase boundaries for the two equilibrium storage states and the non-equilibrium states of such an MTJ cell. The vertical axis measures the magnitude of an external field component, denoted $H_y$, directed along the cell's hard axis (h.a.). The horizontal axis measures the magnitude of an external field component, denoted $H_x$, directed along the cell's easy axis (e.a.). $M_1$ and $M_2$ denote the vector magnetizations of the cell in either of the two stable equilibrium positions along the easy axis directions. $M_3$ denotes a generic magnetization vector of the cell when it is directed along a direction θ as the result of the effect of an arbitrary external field having the components ($H_x$, $H_y$). The magnitude of θ is given by:

$$\sin θ = H_y/H_k$$

where $H_k$ is the shape anisotropy. If $H_y=H_k$, the magnetization vector will be aligned with the hard axis. On turning off the external field completely, the state of magnetization will be unstable and even the slightest perturbing field will cause it to revert to a stable equilibrium direction along the easy axis. An opposing field along the easy axis direction will cause the magnetization to reverse direction to the other easy axis equilibrium state. This irreversible process will happen when the field component along the easy action direction, $H_x$, is at the switching threshold, $H_c$, which has the magnitude $H_c=H_k$. This relationship assumes that the external magnetization is rotating uniformly past the hard axis energy barrier. In practice this does not happen and when the rotation of the external magnetic field is non-uniform, the switching barrier is actually lower than $H_k$ and is found, experimentally, to be approximately $H_k/2$. This value determines the stability of stored information.

In a biosensing (magnetic particle sensing) environment, the same sensor serves to detect the presence or absence of a proximate particle which, as a result of being magnetized, produces a surrounding strayfield, $H_p$. This strayfield has to cause a detectable perturbation in the MTJ cell's state of magnetization. In sensor designs of the prior art, that detectable perturbation is a polarity reversal of the storage states, from $M_1$ to $M_2$ or vice versa. Such a reversal response is advantageous with a biosensor since it generates a non-ambiguous, storable detection result. The drawback is that a comparatively large magnetized particle is required in order for its strayfield $H_p>H_c$. This, in turn, leads to a problem, because large particles are more difficult to manipulate in the analyte (the fluid containing the biological particles being identified). Currently, the compromise particle size is approximately 1 micron.

Because the strayfield, $H_p$, produced by the magnetized particle is fairly small, it is imperative to design MTJ sensors that have a high sensitivity. This is usually achieved by producing sensors with as low a magnetic anisotropy as possible, so that the magnetization is easily changed in direction, but is not too unstable to allow for storage. With such low anisotropy, however, the variations from one MTJ to another become significant and difficult to control. Therefore, it is difficult to design MTJ sensors that can reliably and consistently detect small magnetized beads.

Thus, we see there are several mutually conflicting requirements to constructing an efficient biosensor device based on MTJ cell technology or, for that matter, based on any technology (not necessarily MTJ technology) in which the sensor operates on the basis of a bi-stable state.

In MTJ technology high sensitivity requires low anisotropy. But stability and storage requires high anisotropy. High anisotropy, in turn, requires large particles for detection, since they produce large strayfields. But large particles are difficult to maneuver within an analyte. We shall see below how the present invention solves these problems.

Given the increasing interest in the identification of biological molecules, it is to be expected that there is a significant amount of prior art directed at the use of magnetic MTJ cell sensors (and other magnetic sensors) to provide this identification. An early disclosure of the use of magnetic labels (magnetized particles) to detect target molecules is to be found in Baselt (U.S. Pat. No. 5,981,297). Baselt describes a system for binding target molecules to recognition agents that are themselves covalently bound to the surface of a magnetic field sensor. The target molecules, as well as non-target molecules, are covalently bound to magnetizable particles. The magnetizable particles are preferably superparamagnetic iron-oxide impregnated polymer beads and the sensor is a magnetoresistive material. The detector can indicate the presence or absence of a target molecule while molecules that do not bind to the recognition agents (non-target molecules) are removed from the system by the application of a magnetic field.

A particularly detailed discussion of the detection scheme of the method is provided by Tondra (U.S. Pat. No. 6,875,621). Tondra teaches a ferromagnetic thin-film based GMR magnetic field sensor for detecting the presence of selected molecular species. Tondra also teaches methods for enhancing the sensitivity of magnetic sensor arrays that include the use of bridge circuits and series connections of multiple sensor stripes. Tondra teaches the use of paramagnetic beads that have very little intrinsic magnetic field and are magnetized by an external source after the target molecules have been captured.

Prinz et al. (U.S. Pat. Nos. 6,844,202 and 6,764,861) teaches the use of a magnetic sensing element in which a planar layer of electrically conducting ferromagnetic material has an initial state in which the material has a circular magnetic moment. In other respects, the sensor of Prinz fulfills the basic steps of binding at its surface with target molecules that are part of a fluid test medium. Unlike the GMR devices disclosed by Tondra above, the sensor of Prinz changes its magnetic moment from circular to radial under the influence of the fringing fields produced by the magnetized particles on the bound target molecules.

U.S. Pat. No. 7,031,186 and Patent Application 2004/0120185 (Kang et al) disclose a biosensor comprising MTJ elements.

U.S. Patent Application 2007/0159175 (Prinz) shows on-chip magnetic sensors to detect different types of magnetic particles or molecules.

U.S. Patent Application 2007/0114180 (Ramanathan et al) teaches MTJ channel detectors for magnetic nanoparticles.

U.S. Patent Application 2005/0100930 (Wang et al) discloses detection of biological cells and molecules.

None of the prior art inventions cited above provide a robust method of reliably detecting the presence of small magnetized particles bonded to biological molecules. It is the object of the present invention to provide such a method that has improved sensitivity so as to be able to reliably detect reduced size particles.

SUMMARY OF THE INVENTION

A first object of this invention is to provide a method of determining the presence or absence of small magnetized particles.

A second object of this invention is to provide such a method that detects the aforementioned magnetized particles when they are bonded to chemical or biological molecules and when the chemical or biological molecules are themselves bonded to a substrate.

A third object of the present invention is to provide such a method that uses a sensor having stable and unstable states.

A fourth object of the present invention is to provide such a method that uses the magnetoresistive properties of an array of MTJ cells, together with their associated stable and unstable states, to detect the presence of such small magnetized particles.

A fifth object of the present invention is to provide such an array of MTJ cells and a method of its use, that can reliably and conclusively indicate the presence of a small magnetized particle that is bonded in a given position relative to MTJ cells forming the array.

A sixth object of the present invention is to provide such an array of MTJ cells wherein detection errors due to the varying magnitudes of the small magnetic fields are reduced.

A seventh object of the present invention is to provide such an array of MTJ cells wherein the registration of indications of the presence of small magnetic particles is energetically stable, so that reliable counts of such detections can be made.

An eighth object of the present invention is to provide such an array of MTJ cells wherein the energetic stability of the cell does not adversely affect the cell sensitivity to the affects of small magnetic fields.

The stated objects of the present invention will be achieved by a magnetic sensor formed as an array of sensor elements that are stable with respect to magnetic and thermal perturbations, yet are sufficiently sensitive to correctly register the presence of proximate magnetic particles (i.e. particles that can be magnetized). Such sensors should have at least two stable low energy states (preferably, the sensor elements should be bi-stable) and they should have at least one unstable state (of intermediate energy) into which they can be placed and within which they can be maintained and from which they can then be made to relax to the stable states under the action of a perturbation.

In a preferred embodiment of the present invention, the sensor is an MTJ cell for which the necessary bi-stability is supplied by an elliptical design that produces an energetically bi-stable MTJ cell element when either of its two free layer magnetization directions is along its easy axis, which is the long axis of the ellipse. The required sensitivity of the cell is provided by the fact that, preferably while proximate magnetic particles are present, the magnetization of the cell free layer is first set and maintained, by a current induced field, along its hard axis, which is an energetically unstable equilibrium configuration of magnetization for the cell. Then the magnetic particles are magnetized by a magnetic field polarized in one direction and the current induced field maintaining the unstable equilibrium state is eliminated, allowing the state of unstable equilibrium to transition to one of the stable equilibrium states.

In the prior art, the presence of a proximate magnetized particle is registered when the bi-stable MTJ cell switches from one of its stable-equilibrium easy axis magnetization directions to the other stable-equilibrium easy axis magnetization direction as a result of the magnetic field of that proximate particle. Such a transition requires a strong magnetic field to cross the energy barrier between the two stable states. In the present invention, such a registry occurs when the magnetization switches from the unstable equilibrium hard axis direction, to first one and then the other one of the stable-equilibrium easy axis directions as a result of two successive magnetizations of the magnetic field with two different polarities. Such a change in magnetization direction from a state of unstable equilibrium to a state of stable equilibrium requires a much smaller "tipping field" than the large field required to shift from one of the two stable positions to the other. It is then only necessary for the strayfield to be a tipping field, rather than a field of sufficient magnitude to switch between the two stable states of the cell. We emphasize that although an embodiment of the present invention is in the form of an MTJ cell having an elliptical aspect and easy and hard directions, other sensor technologies can also be applied if the sensor element has more than one state of stable equilibrium and at least one state of unstable stability.

Referring successively to FIGS. 5(a), 5(b), 5(c), and 5(d) there is shown in each figure an illustration that is useful for comparing the merits of different approaches to fulfilling the objects stated above. These figures are qualitative but reflect the experimental observation that that there is always a significant statistical dispersion in the characteristics of cells as well as particles. Let us assume, therefore, a distribution of strayfields, $H_p$, characterizing a population of particles. There is also a distribution of switching fields, $H_c$, over a population of sensors, with that distribution varying in value between a low $H_{c1}$ and a high $H_{c2}$. We will project the consequences of (a): the present method using a large particle; (b): the present method using a smaller particle; (c): accommodating the smaller particle by reducing $H_c$, for example, through the use of a sensor geometry having a smaller aspect ratio and: (d): the present method using even a smaller particle. Note that $H_b$ in the figure represents the small tipping field required to send the magnetization from its hard-axis position to one of the stable easy-axis positions. The projected consequences will be labeled as satisfactory ("OK") when $H_p > H_c$, they will be labeled as undetermined ("?") when $H_{c1} < H_p < H_{c2}$ and will be labeled as false ("NO") when $H_p < H_{c1}$. There is an additional quality factor: having a large $H_{c1}$ guarantees correct retention of the detection result.

FIG. 5(a) suggests that current sensor technology will provide essentially 100% correct responses when the magnetized particles are sufficiently large (approximately 1 micron).

FIG. 5(b) suggests there will be a mixture of correct and incorrect responses when current sensor technology is used in conjunction with smaller particles (less than approximately 1 micron).

FIG. 5(c) suggests a mixture of correct and incorrect results.

FIG. 5(d) suggests a successful outcome for the method of the present invention.

The results of FIGS. 5(a)-5(d) is to suggest that the present technology with large particles (FIG. 5(c)) provides a reasonable base-line. With smaller particles, however, as in FIG. 5(b), the results are problematic. While reduction of the shape anisotropy will reduce the average value of $H_c$, as in FIG. 5(c), it will also increase the dispersion of $H_c$. This experimental observation is not surprising since it is the shape anisotropy of the sensor which defines its response characteristics relative to other perturbations, such as magnetostrictive, magnetostatic, etc. Therefore, the sensor becomes sensitive to a host of difficult-to-control factors that would otherwise not be troublesome. Consequently there are many undetermined sensor responses when $H_p < H_{c2}$. Finally, as shown if FIG. 5(d), the method of the present invention yields a correct response when the strayfield of the particle is larger than the "tipping field", $H_b$, and should, therefore, work with much smaller particles. In addition, the fact that the shape anisotropy can be retained assures that the dispersion of operating characteristics will be small and a large $H_{c1}$ with the associated reliable retention of the detection results.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1 (prior art) is a schematic representation of a magnetic particle bonded to a target molecule and the target molecule bonded to a receptor site.

FIG. 2 (prior art) is a schematic cross-sectional representation of a magnetic sensor such as is positioned beneath the substrate of FIG. 1.

DESCRIPTION OF THE PREFERRED EMBODIMENT

Figure 3:
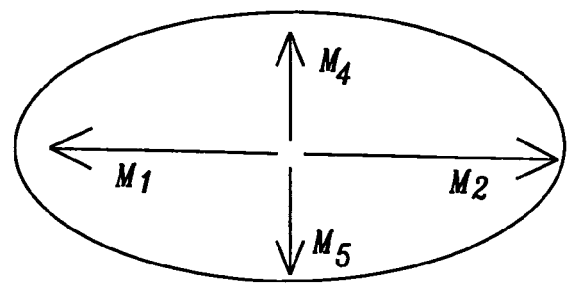
FIG. 3 (prior art) is a schematic illustration of the states of magnetization in a sensor element having an elliptical geometry. The states are indicated in an overhead view of the sensor of FIG. 2.
Figure 4:
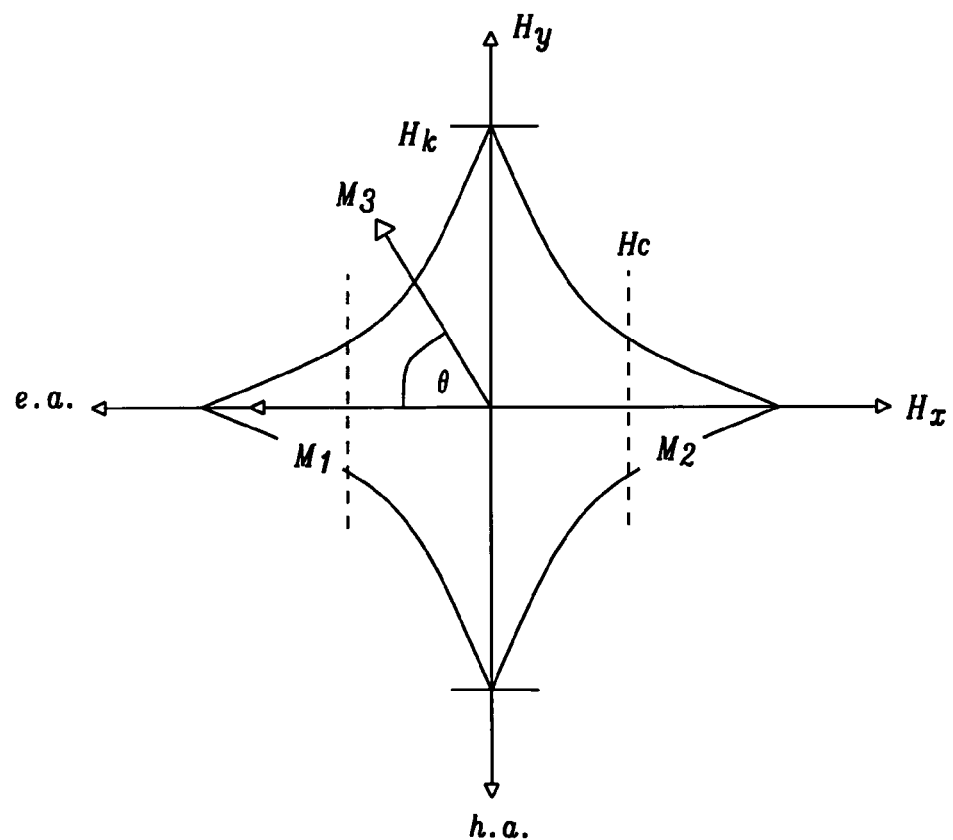
FIG. 4 (prior art) is a drawing of an asteroidal phase diagram, indicating the relationship between external magnetic fields and the magnetization of the MTJ sensor cell.
Figure 5A:
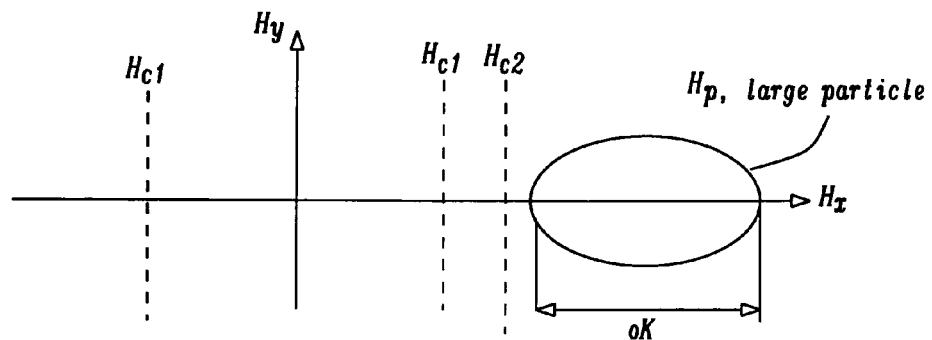
FIGS. 5($a$), 5($b$), 5($c$) and 5($d$) are schematic representations suggesting how the operating margins are affected by particle size for several methods for detecting magnetized particles, including the present invention, which is shown in FIG. 5($d$).
Figure 5B:
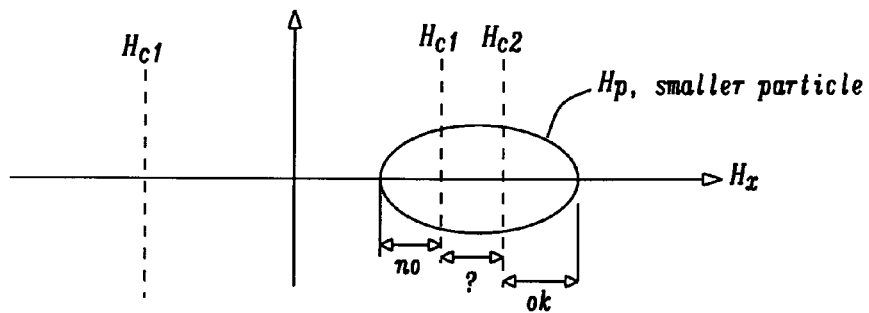
Figure 5C:
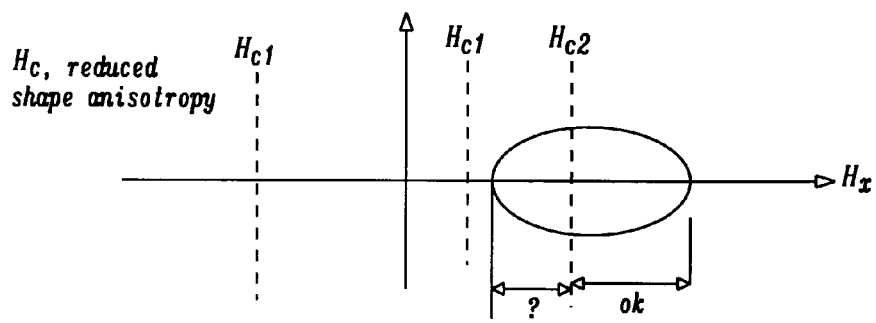
Figure 5D:
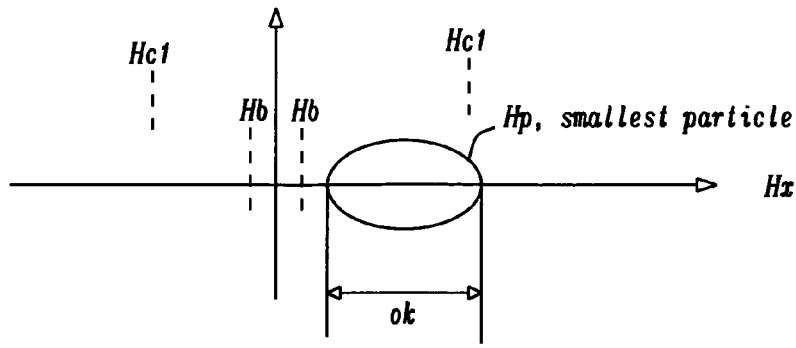

The preferred embodiment of the present invention is a magnetic sensor for detecting the presence of small magnetized particles that are bonded to biochemical species in an analyte, so the sensor, in actuality, becomes a sensor of the molecular species by sensing the magnetic particles bound to them. These species are, in turn, caused to be bonded to sites on the substrate of the sensor, so that the magnetic particles are also then, in effect, affixed to the substrate. The sensor includes a regular array of sensor elements, each of which has (at least) two low energy states of stable equilibrium and (at least one) state of intermediate energy unstable equilibrium which can be made to transition into either of the (at least two) stable states by the presence of a nearby magnetized particle, such as the particle affixed to the bonded species. The sensor includes a mechanism for placing each element in its unstable state and a mechanism (which can be the same mechanism) for maintaining each element in its unstable state. It also includes a mechanism for magnetizing the small magnetic particles in two polarities once they have become affixed to the binding sites on the substrate. This mechanism for magnetizing the particles is, preferably, an external magnetic field which can be directed perpendicularly to the sensor substrate with two polarities, eg. towards and away from the substrate. When this external field is activated, the magnetic particles are magnetized and produce their strayfields. When the external field is off, the magnetic particles are no longer magnetized and they produce no strayfields. As already noted in FIG. 1, the magnetizing field, without the presence of a magnetic particle, will not enable the switching of magnetic states of the sensor element because the direction of the magnetizing field is perpendicular to the sensor plane. The strayfield of a magnetized particle, however, will have a component in the plane of the sensor and can cause transitions within the sensor element as discussed below.

When the sensor elements are placed in their unstable states but the mechanism to maintain those states is not acting, the presence of a perturbing field is sufficient to cause whichever element is subjected to the field to transition from the unstable state to one of the stable states. The stable states must be characterized by some measurable quantity that enables them to be differentiated from each other, so that transitions from the unstable state to either of the stable states can be distinguished. During operation of the sensor, the perturbing field of a proximate magnetic particle is allowed to cause two successive relaxations of the same element from its unstable equilibrium state to one of its stable states, with the element being reset to its unstable state at the initiation of each relaxation event. In each successive operation, the proximate magnetic particle is magnetized by an external magnetic field in each of two different polarities (i.e., field directions relative to the sensor substrate). In this way, the final equilibrium state of the element is different in each trial, enabling an inference that the particular element was indeed proximate to a magnetized particle. If there is no magnetic particle proximate to a given element, the two successive trials will yield relaxations to the same stable equilibrium state, since the polarity of the external magnetic field used to magnetize magnetic particles will have no effect on a sensor element in the absence of the induced strayfield of a proximate magnetic particle.

The particular sensor of the present preferred embodiment comprises a substrate containing (or covering) a regular array of sensor elements that are MTJ cells positioned at the orthogonal crossings of parallel rows of conducting lines. The MTJ cells have a substantially elliptical shape of aspect ratio significantly greater than 1, so as to produce a relatively high value of $H_k$, the magnetic anisotropy which is induced by the shape anisotropy of such a high aspect ratio shape. The MTJ cells have two magnetization states (a "bi-stable" state) of stable equilibrium which are directed along their easy magnetic axis, which is the long axis of the ellipse. These states are normally the "storage" states of an MTJ cell when it is used in an MRAM array. Each state is a low energy state of stable equilibrium, but an energy barrier provided by the magnetic anisotropy of the cell prevents a transition from one state to the other without a significant external perturbation.

The short axis of the ellipse determines the hard magnetic axis, which provides a position of unstable equilibrium for the cell magnetization. These states are higher energy states than those along the easy axis direction. When current passes through the conducting lines that are oriented parallel to the easy axis of the sense elements (e.g. of the MTJ cell), the current-induced magnetic fields of those lines cause the magnetization of the MTJ cells to become oriented along the hard axis of the MTJ cell free layer, which is the position of unstable equilibrium. We shall term those current-induced magnetic fields the "hard direction fields." When those hard direction fields are turned off, even a small perturbing "tipping field" produced by the strayfields of proximate magnetized particles captured on the sensor substrate can easily cause a transition between the magnetization of a cell in its higher energy unstable equilibrium position defined by the hard axis of the cell, to a stable low energy equilibrium position defined by its easy axis. The shift of the cell magnetization from the hard axis direction to one or the other of the easy axis directions produces a final state with a measurable resistance that will be low, if it is parallel to the magnetization of the fixed layer and high if it is antiparallel to the magnetization of the fixed layer. If such a transition is performed twice in succession, with an external magnetizing field whose polarity is changed for each transition, then when a magnetic particle is in a fixed position proximate to an MTJ cell and produces a strayfield that is induced by the polarity of the external field, the final stable equilibrium states will have an oppositely directed magnetization after each succeeding transition. Since the resistance of the MTJ cell is determined by the direction of this free layer magnetization relative to the fixed magnetization direction of the fixed layer of the MTJ cell, the difference in final resistances can be measured and used to indicate the presence of a magnetic particle and, correspondingly, the capture of a biochemical species.

The proximate magnetic particle is magnetized, after being bound to the substrate, by an external magnetic field directed substantially orthogonally to the hard and easy axes of the cell's free layer, such as has already been shown in FIG. 1. After the proximate magnetic particle has been magnetized and while its magnetizing field remains in effect, the hard direction field is removed by turning off the currents in the conducting lines that are parallel to the easy axis, so that the strayfield remains to trigger the transition of the proximate cell from its unstable intermediate equilibrium state (the hard axis state) to one of the bi-stable states (the easy axis state).

Figure 6A:
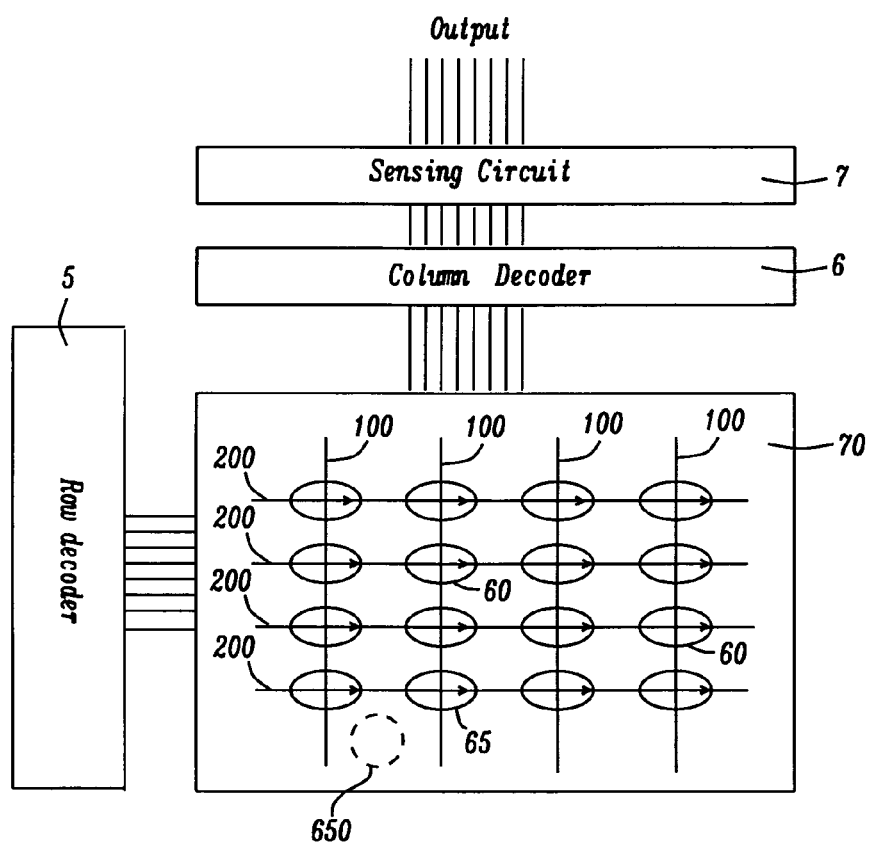
FIGS. 6$a$-6$f$ are a succession of schematic illustrations of an array of the high-aspect ratio MTJ cells of an embodiment of the present invention demonstrating the steps of the process by which a magnetic particle is detected.

Referring to FIG. 6a there is shown a schematic illustration of a magnetic sensor formed as a planar MTJ array employing exemplary, high aspect ratio elliptical MTJ cells (60) (the sensing elements) of a type shown in greater detail in FIG. 2. The cells are formed beneath or within a planar substrate (70) on which are formed bonding sites (not shown) for molecular species to be analyzed. There is also shown a schematic indication of exemplary circuitry (5), (6), (7), required to identify the presence of captured magnetized particles based on comparing successive resistance measurements of the individual cells as will be discussed further below. The free layer magnetization direction of all the cells are shown as arrows pointing to the right. It may be assumed that the magnetic directions of their fixed layers, which are not shown, are similarly directed, so the cells would be in their low resistance states. The array includes a row (5) and column (6) decoder to identify the locations of MTJ cells in the array and measure their resistances to determine which cells have been activated by the magnetic fields of a proximal magnetized particle in accord with the method of the invention. The array also includes conducting lines (200) that are parallel to the easy axis of the cells and which can produce hard direction fields to set the magnetization of the cells in the hard axis unstable state.

Figure 6B:
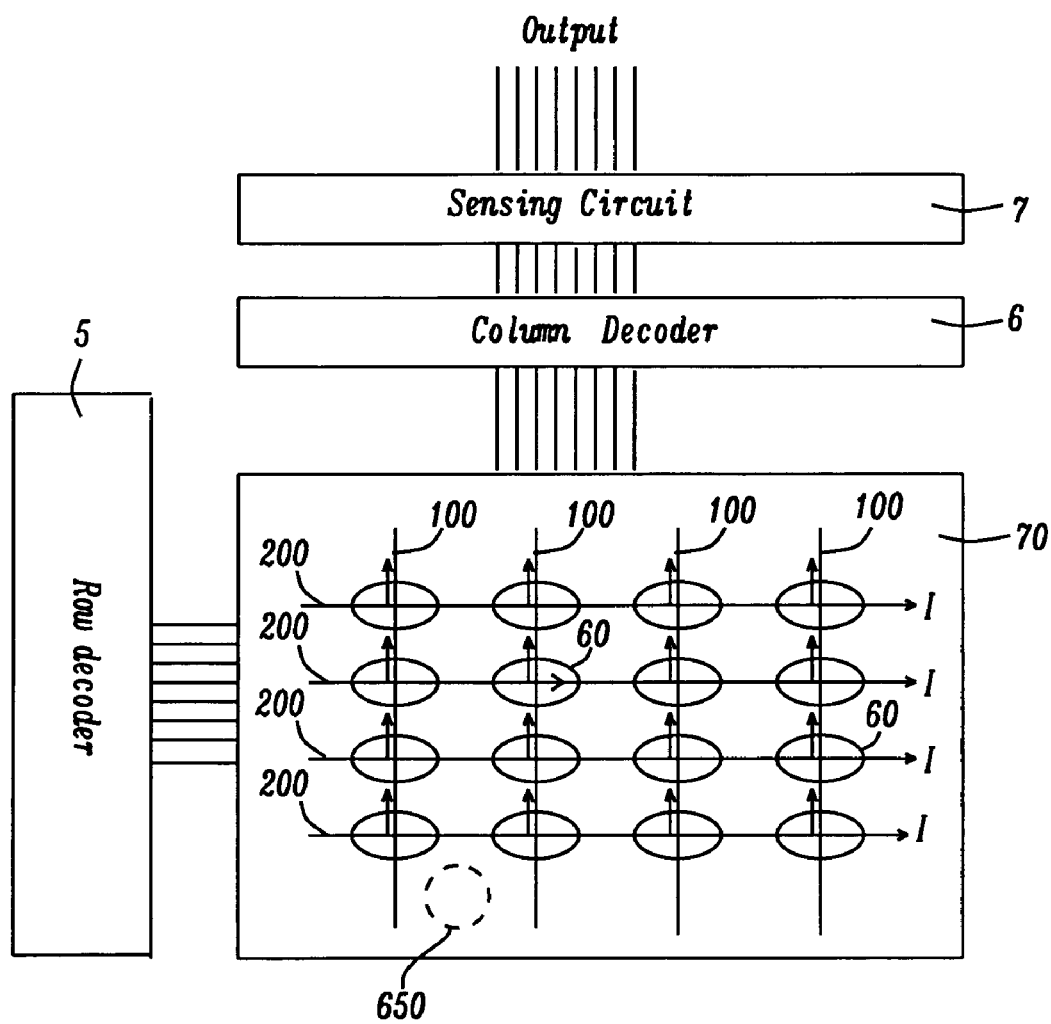
Figure 6C:
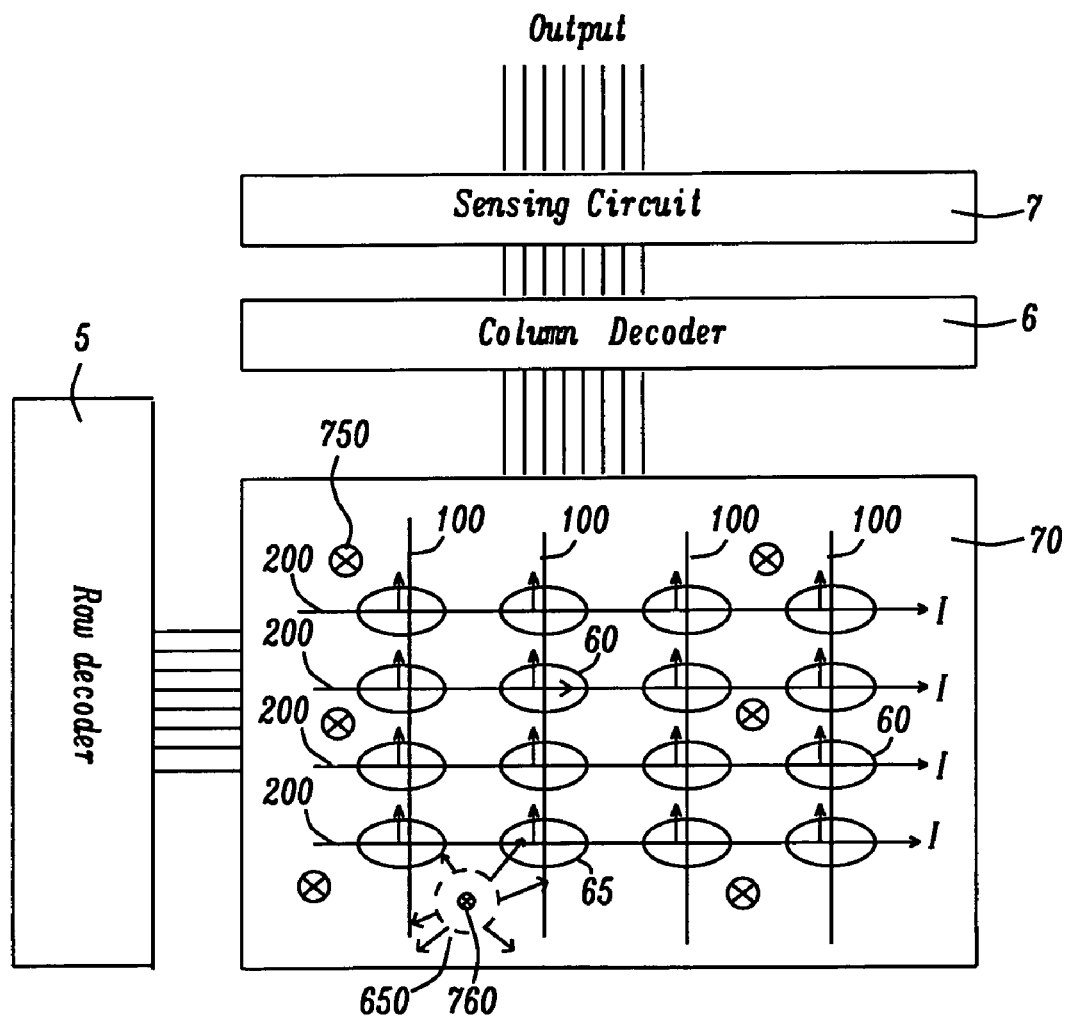
Figure 6D:
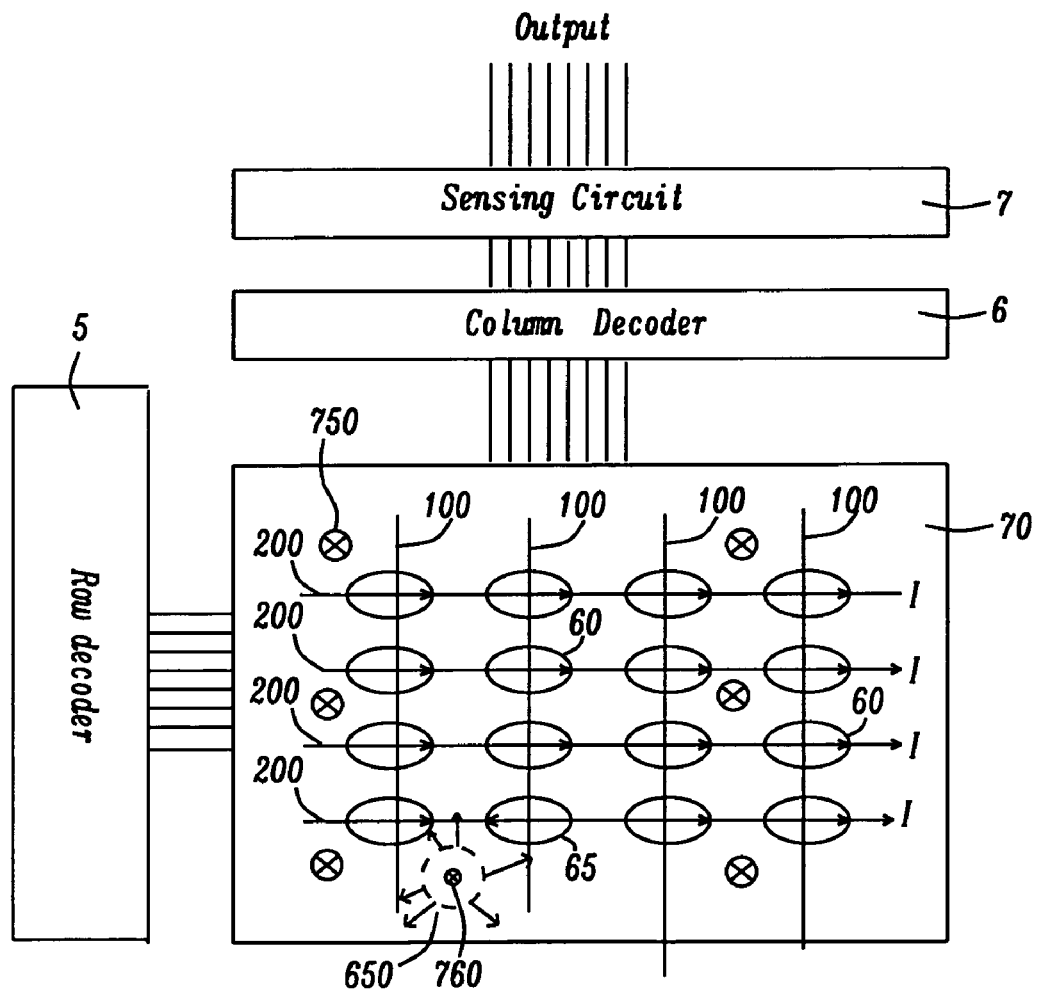
Figure 6E:
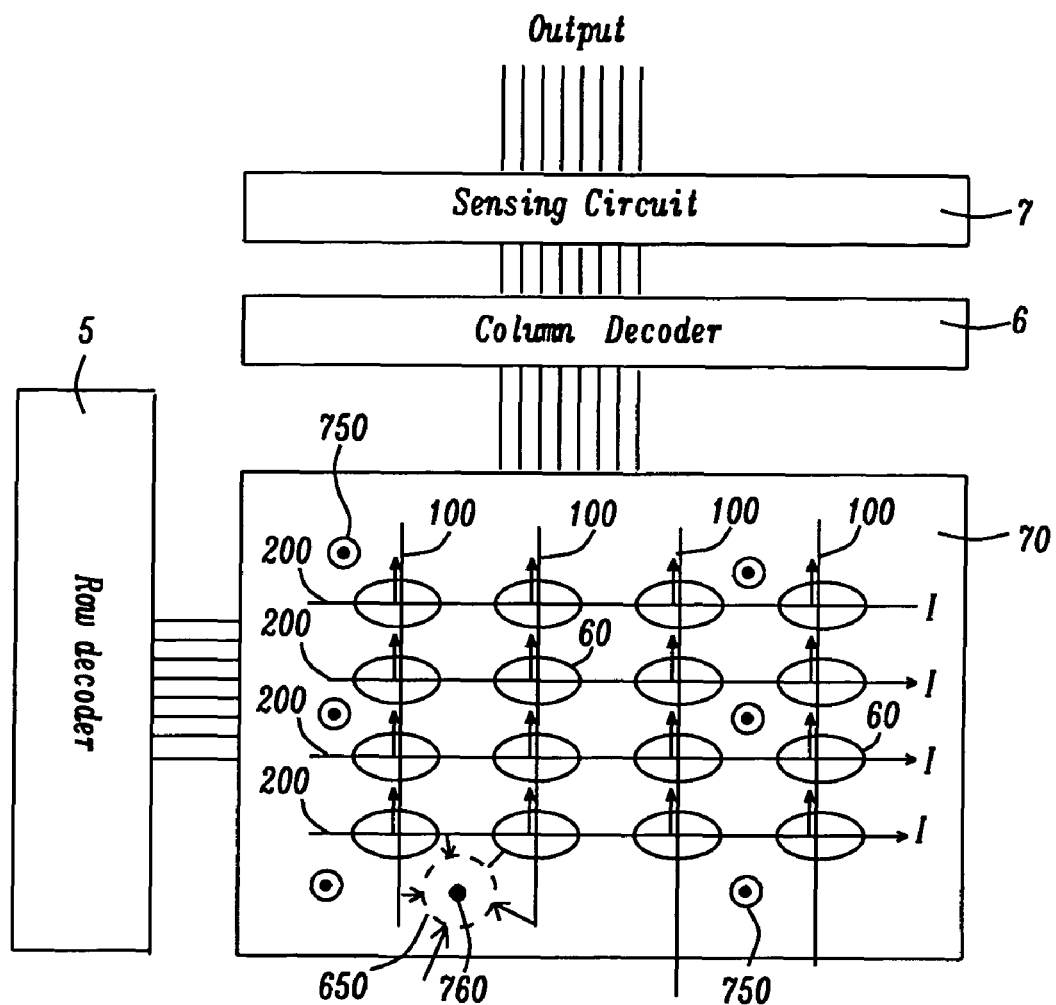
Figure 6F:
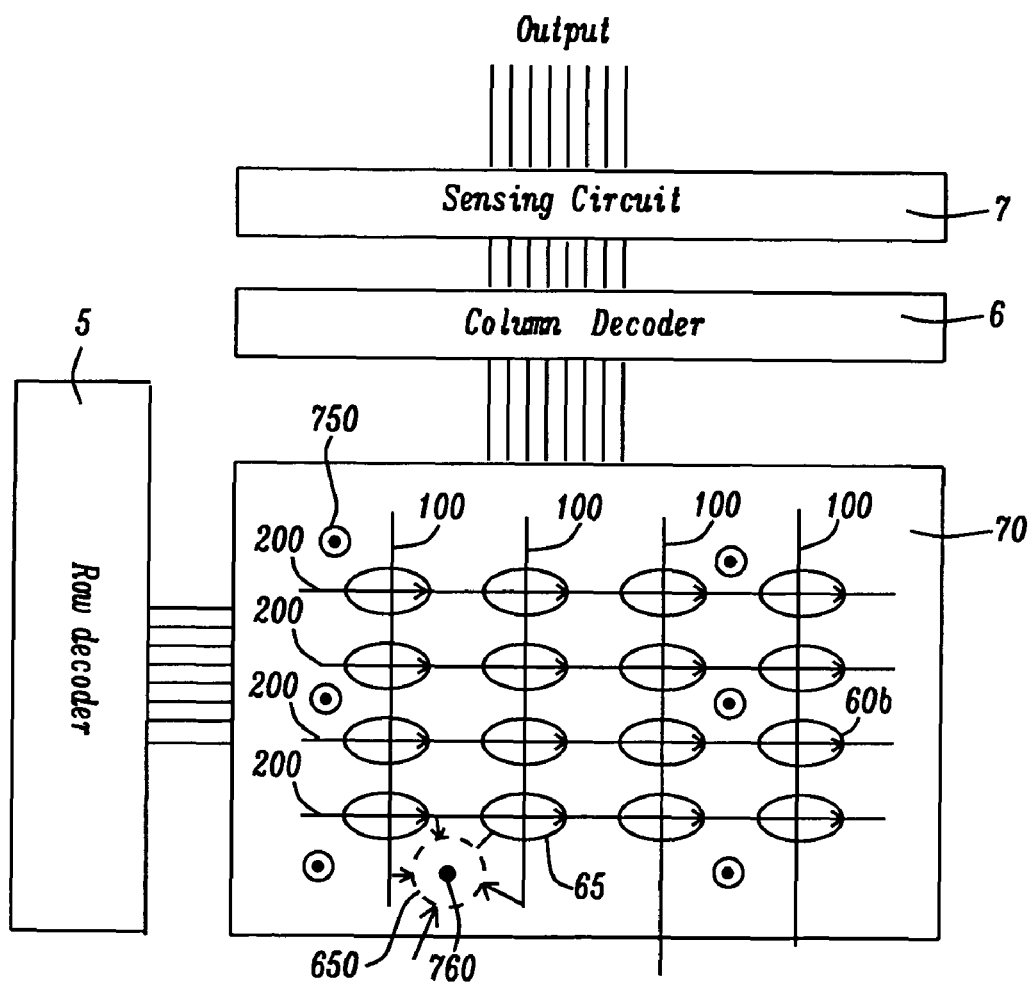

In accord with the method of the invention the sensor operates in accord with the following process steps shown sequentially, beginning with in FIG. 6a above:

1. An analyte containing molecular species labeled with magnetic particles is brought into contact with the array substrate (70) so that the magnetic particles (i.e. the molecular species to which they are attached) are captured at positions proximate to MTJ cells (60) in the array. For exemplary purposes, we will assume that a molecular species and its attached magnetic particle (shown as a circle (650)) have been captured adjacent to cell (65). The cells are typically in one or another of their stable equilibrium states and the magnetic particles have not yet been magnetized. This configuration is illustrated schematically in FIG. 6a.
2. Referring to schematic FIG. 6b, there is shown that while the magnetic particle (650) is affixed to its position or before the particle is affixed, the hard direction field is turned on by a current, I, in lines (200), thereby causing all the MTJ cells (60) to transition to a specific one of their unstable states (arrows pointing up) and to remain in that state. FIG. 6b shows that the magnetization of the free layers of all cells is now pointed in a direction in accord with the induced magnetic field of the lines (200).
3. Referring to FIG. 6c, there is shown schematically that an external magnetizing field having a first polarity (e.g., directed downward (750) relative to the array plane) is turned on, magnetizing (760) the captured magnetic particle (650) and producing strayfields (shown as radially-outward extending arrows) at the positions of the MTJ cell (65) proximate to the position of the magnetic particle.
4. Referring to schematic FIG. 6d, there is shown that the hard direction field is turned off, (there is no current in lines (200)) causing all MTJ cells to relax to their initial stable, low energy equilibrium states. Although the external magnetic field (750) is still on, it does not affect the transition of the MTJ cells. The MTJ cell (65) proximate to the captured magnetic particle (650) transitions to a high resistance state (left-pointing free layer magnetization) which is induced by interaction with the in-plane components of the local strayfield perturbations (radial arrows).
5. Resistance measurements are made of all MTJ cells.
6. Referring now to FIG. 6e, there is shown the external magnetic field is off and the MTJ cells are once again placed in their unstable states by activation of the hard direction field (current in lines (200) again turned on), after which the magnetic particle magnetizing field is also turned on (750), but with a second polarity that is opposite to the first polarity and now points out of the figure plane (circle with a central dot). The magnetic particle is once again magnetized with strayfield components indicated as inward pointing arrows.
7. Referring now to schematic FIG. 6f, there is shown the hard direction field is turned off, allowing the second polarity perturbative strayfields to cause a relaxation of proximate MTJ cells to a stable state that is opposite in magnetic direction to the state induced by the first polarity strayfields. Those MTJ cells not proximate to a captured particle relax to the same state as in FIG. 6d.
8. Resistance measurements are made of all MTJ cells and compared with the resistance measurements in step 5.
9. The resistance measurement of step 5 and step 8 are subtracted (or otherwise compared), producing a non-zero value only at cells proximate to a captured magnetic particle and thereby determining the number of such captured magnetic particles.

The easy axis of each MTJ cell in the sensor array should be well defined. This can be achieved, for example, by patterning the cells to produce an appropriate shape anisotropy, such as the elliptically formed cells indicated in the present figure which have an aspect ratio significantly greater than 1.

As is finally understood by a person skilled in the art, the preferred embodiments of the present invention are illustrative of the present invention rather than limiting of the present invention. Revisions and modifications may be made to methods, materials, structures and dimensions employed in forming and providing a magnetic sensor comprising an array of addressable MTJ cells having a high aspect ratio for a bi-stable state and an unstable state, a method for placing their magnetizations in the unstable state, a method for inducing a transition back to the bi-stable state in accord with an externally induced strayfield of a proximate captured magnetic particle, a method of measuring resistance differences resulting from successive strayfield-induced transitions induced by two different external magnetic field polarities and an associated data analysis algorithm that permits the detection of the magnetized particles bound to the sensor array, while still forming and providing such a magnetic sensor and its method of formation in accord with the spirit and scope of the present invention as defined by the appended claims.

What is claimed is:

1. A magnetic sensor comprising:
   A planar array of multi-state sensor elements, wherein said multi-state sensor elements are MTJ cells, wherein each MTJ cell includes a fixed layer of spatially fixed magnetization direction and a free layer of movable magnetization direction, wherein said free layer has an easy axis that determines two low energy states of stable magnetic equilibrium corresponding to the magnetization of said free layer being oriented in either of two directions along said easy axis and wherein said free layer has a hard axis that defines two intermediate energy states of unstable equilibrium when the magnetization of said free layer is oriented in either of two directions along said hard axis, wherein a resistance of said MTJ cell is a function of the relative alignments of said free layer magnetization and said fixed layer magnetization and wherein differences of said resistances are measurable and a magnetic field within said array for placing said element into one of said two intermediate energy states of unstable equilibrium; and a magnetic field within said array for maintaining said element in said at least one intermediate energy state of unstable equilibrium; whereby while said element is in said unstable equilibrium state but not being maintained therein, said element will transition from said unstable equilibrium state to one of said two stable equilibrium states by interacting with an external perturbative magnetic field produced by a bound magnetic particle; and wherein a transition between each of the two low energy states produces a maximal resistance variation by which the presence of said bound particle is determined.

2. The magnetic sensor of claim 1 further comprising a planar substrate formed over said array on which substrate is formed a plurality of sites for binding molecular species, to which species there are attached magnetic particles which are thereby also bound at said sites.

3. The magnetic sensor of claim 2 wherein said bound magnetic particles are magnetized by being subjected to an external magnetic field of a given polarity, producing thereby a surrounding strayfield corresponding to said polarity.

4. The magnetic sensor of claim 3 wherein said transition of said element is effected by means of said strayfield produced at said element by one of said bound magnetized particles proximate to said element.

5. The magnetic sensor of claim 4 wherein said polarity determines to which of said at least two stable equilibrium states said element transitions.

6. The magnetic sensor of claim 1 further including a mechanism for measuring said measurable quantity.

7. The magnetic sensor of claim 1 wherein each said MTJ cell is patterned with a horizontal cross-sectional shape having a long axis that is said easy axis and a short axis that is said hard axis, wherein said long and short axes are substantially perpendicular, said shape producing thereby a magnetic anisotropy sufficient to render said equilibrium magnetizations thermally and magnetically stable when they are directed along said long axis, while causing a magnetization along said short axis to be a position of unstable equilibrium and allowing a magnetic perturbative tipping field to produce a transition between said unstable magnetic equilibrium position and said stable magnetic equilibrium position while said position of unstable equilibrium is not being maintained.

8. The magnetic sensor of claim 7 further including an orthogonal array formed of vertically separated, orthogonally directed parallel sets of conducting wires, wherein an MTJ cell is located adjacent to an orthogonal crossing of said wires and wherein one set of parallel wires is oriented parallel to said long axis of said MTJ cell, whereby current induced magnetic fields produced by said set of wires parallel to said long axis at the location of said MTJ cell magnetizes said cell in a position of unstable equilibrium and maintains said cell in said position of unstable equilibrium while said current exists.

9. HThe magnetic sensor of claim 1 wherein said perturbative magnetic field is produced by the strayfield of a proximate magnetic particle having a size that is less than 1 micron, wherein said proximate magnetic particle is bound to a site on said substrate and wherein said proximate magnetic particle has been magnetized by an external magnetic field that is directed orthogonally to said substrate.

10. The magnetic sensor of claim 9 wherein said perturbative magnetic field is insufficient in magnitude to cause a direct transition between said two stable equilibrium states but wherein said perturbative field is of sufficient magnitude to cause a transition between said unstable equilibrium state and said stable equilibrium state while said unstable equilibrium state is not maintained by a current-induced magnetic field.

11. A method for detecting the presence of a bound magnetic particle comprising:

providing a substrate on which is formed a planar array of multi-state magnetic field sensors wherein each sensor has two measurably distinguishable low energy stable equilibrium states and an unstable intermediate energy state into which said sensor can be placed and within which said sensor can be maintained by activation of a maintenance mechanism, wherein a transition from said unstable intermediate state to either of said low energy stable equilibrium states can be induced by the presence of a perturbative magnetic field and wherein each sensor is proximate to a site on said substrate at which a magnetic particle can be bound; then placing and maintaining each of said of magnetic field sensors in said unstable intermediate state; and binding at least one magnetic particle to a site; then contacting said magnetic particle with a substantially uniform external magnetic field directed substantially perpendicularly to said substrate whereby said magnetic particle is magnetized with a first polarity and produces a strayfield corresponding to said polarity; then deactivating said maintenance mechanism, whereby said magnetized magnetic particle causes a proximate magnetic field sensor to transition to one of said measurably distinguishable stable equilibrium states in accord with said strayfield while remaining magnetic field sensors relax to a common equilibrium state; then determining the state of each magnetic field sensor; then again placing and maintaining each of said of magnetic field sensors in said unstable intermediate state; and again contacting said magnetic particle with an external magnetic field whereby said magnetic particle is magnetized with a second polarity that is opposite to said first polarity and produces a strayfield corresponding thereto; then deactivating said maintenance mechanism, whereby said magnetized magnetic particle causes a proximate magnetic field sensor to transition to one of said measurably distinguishable stable equilibrium states in accord with said strayfield while remaining magnetic field sensors relax to said common stable equilibrium state; then determining the state of each magnetic field sensor; whereby, said proximate sensor will have been determined to have transitioned to two different stable equilibrium states, by which can be inferred the presence of said bound magnetic particle.

12. The method of claim 11 wherein each of said array of magnetic sensors is an MTJ cell located at an intersection of orthogonal current carrying lines and wherein said two stable low energy equilibrium states is provided by patterning each said cell in a horizontal shape of high aspect ratio having a long axis and a short axis, wherein an easy axis of magnetization is produced along said long axis and a hard axis of magnetization is produced along said short axis and whereby a magnetization of a free layer of said cell along either direction of said long axis provides two stable low energy equilibrium states and whereby a direction of magnetization along said hard axis produces an intermediate energy unstable state and wherein the low energy states of said cells can be distinguishably determined by resistance measurements of said cells and wherein a flip between each of the two low energy states produces a maximal resistance variation by which the presence of said bound particle is determined.

13. The method of claim 12 further comprising an array of parallel current carrying wires, formed parallel to said easy axis, wherein a current in said wires will orient a magnetization of said free layer in a hard axis direction and wherein maintaining said current will maintain said magnetization in said hard axis direction.

14. The method of claim 11 wherein said strayfield contacts said magnetic sensor with a field component that causes said unstable state to transition to a specific one of said stable low energy equilibrium states.

15. The method of claim 14 wherein said magnetized particle is less than approximately 1 micron in size and is bound to a chemical or biological molecule which is itself bound to said substrate surface by a binding site that is specific to said molecule.

* * * * *